United States Patent [19]

Hutson

[11] 4,079,407

[45] Mar. 14, 1978

[54] SINGLE CHIP ELECTRONIC SWITCHING CIRCUIT RESPONSIVE TO EXTERNAL STIMULI

[76] Inventor: Jearld L. Hutson, P.O. Box 34235, Dallas, Tex. 75234

[21] Appl. No.: 787,699

[22] Filed: Apr. 14, 1977

Related U.S. Application Data

[63] Continuation of Ser. No. 565,658, Apr. 7, 1975, abandoned.

[51] Int. Cl.² .......................................... H01L 29/747
[52] U.S. Cl. ...................................... 357/39; 357/27; 357/40; 357/49; 357/51; 357/55; 357/86; 307/284
[58] Field of Search ...................... 357/27, 37, 39, 40, 357/49, 51, 55, 86; 307/284, 296

[56] References Cited

U.S. PATENT DOCUMENTS

| 3,317,746 | 5/1967 | Hutson | 357/39 |
| 3,475,666 | 10/1969 | Hutson | 357/39 |

OTHER PUBLICATIONS

E. Honell, et al., "Triac Control for AC Power," G.E. Application Note, May 1964, pp. 1-7.
J. McDermolt, "The Hall Effect: Success at 90," Electronic Design, vol. 21, Oct. 11, 1969, pp. 38-45.
M. Oppenheimer, "In IC Form, Hall Effect Devices can take on many new applications," Electronics, Aug. 2, 1971, p. 46.

Primary Examiner—Stanley D. Miller, Jr.
Assistant Examiner—Joseph E. Clawson, Jr.
Attorney, Agent, or Firm—Richards, Harris & Medlock

[57] ABSTRACT

An actuator-switch system formed on a unitary semiconductor body is provided which is sensitive to external stimuli. The semiconductor body includes at least five layers of alternating first and second semiconductor conductivity types, with structure extending through outer layers of the body to electrically isolate and separate the actuator from the switch. Upon sensing the eternal stimuli, the actuator injects carriers into at least one intermediate layer common to both the actuator and the switch to cause the switch to change states. Preferred embodiments include a magnetic sensitive device controlling the state of a flipflop, an inverter transistor sensitive to the state changes of the flipflop, and an SCR which when triggered by the inverter transistor injects carriers into a common intermediate layer to cause a switching action. Additional embodiments include an actuator powered by a D.C. source independent of the switch, and an actuator powered by D.C. voltages derived in part from a D.C. source and in part from the full-wave rectification of an externally supplied A.C. signal, with either the switch or an auxiliary area of the body constituting a half of a full-wave rectifier bridge prior to the occurrence of a switching action.

11 Claims, 10 Drawing Figures

U.S. Patent   March 14, 1978   Sheet 3 of 3   4,079,407 ers have been formed on several different semiconductor bodies. Such prior devices have thus often been relatively expensive to fabricate and to interconnect, and have often not provided completely satisfactory performance characteristics. Prior devices have also often required separate sources of electrical power, when it would be advantageous to operate the device with only a single electrical power source.

SINGLE CHIP ELECTRONIC SWITCHING CIRCUIT RESPONSIVE TO EXTERNAL STIMULI

RELATED APPLICATONS

This application is a continuation of application Ser. No. 565,658, filed on Apr. 7, 1975, now abandoned, which disclosed and claimed improvements of devices described in copendng patent application Ser. No. 724,916, filed Sept. 20, 1976 entitled "Multilayer Semiconductor Switching Device" by the present applicant, which is a continuation of application Ser. No. 488,789, filed July 5, 1974, now abandoned.

FIELD OF THE INVENTION

This invention relates to semiconductor devices, and more particularly relates to an actuator and semiconductor switch formed on a single semiconductor body.

THE PRIOR ART

Semiconductor devices embodying an actuator and an electronic switch have been heretofore proposed for utilization in solid state light dimmer switches and as solid state relays to replace conventional contact relays and the like. However, such previously developed semiconductor devices have often been excessively bulky and have been formed on several different semiconductor bodies. Such prior devices have thus often been relatively expensive to fabricate and to interconnect, and have often not provided completely satisfactory performance characteristics. Prior devices have also often required separate sources of electrical power, when it would be advantageous to operate the device with only a single electrical power source.

SUMMARY OF THE INVENTION

The present invention provides an electronic switching device formed on a unitary semiconductor body so as to be responsive to an external stimuli. The semiconductor body is comprised of a plurality of semiconductor layers ordered in an array of alternating conductivity types. Grooves extend through at least one of the exterior layers to physically separate and electrically isolate two areas of the body, with at least one intermediate layer common to and electrically accessible to each of the two areas. An actuator responsive to external stimuli is formed in one of the two areas, and a semiconductor switch responsive to signals injected by the actuator into a common intermediate layer is formed in a second of the two areas.

More particularly, a sensitive actuator and a semiconductor switch are formed on a unitary semiconductor body having at least five layers of alternating first and second semiconductor conductivity types. The outer layers and one of the intermediate layers are constructed from the first conductivity type. Grooves formed across the outer layers extend through at least one of the body layers to geometrically and electrically isolate first and second areas of the body, having at least one intermediate layer common to and electrically available to both areas. First regions of the second conductivity type are formed over the outer layers in the first and second areas, and electrode pairs are formed in contact with the outer layers and the first regions to provide a semiconductor switch in the second area. Second regions of the first conductivity type are diffused into at least one of the first regions in the first area to form the sensitive actuator, which provides switching signals through an intermediate layer to cause a switching operation of the semiconductor switch. Additional grooves are formed into the outer layers of the semiconductor not only to electrically isolate and separate apart component parts of the actuator, but also the electrode pairs of the switch.

In one aspect of the invention, a third area of the semiconductor body is electrically isolated and separated apart from the other two areas by grooves to form a half of a fullwave rectifier bridge, and thereby provide D.C. power to the actuator from an external A.C. source.

In another aspect of the invention, the semiconductor switch prior to changing state forms a half of a fullwave rectifier bridge to provide D.C. power to the actuator from an external A.C. source.

In a further aspect of the invention, power is supplied to the actuator partly from a D.C. source and partly from an A.C. source rectified by the switch prior to a switching action.

DESCRIPTION OF THE DRAWINGS

For a more complete understanding of the present invention and for further objects and advantages thereof, reference is now made to the following description taken in conjunction with the accompanying drawings, in which.

DESCRIPTION OF THE PREFERRED EMBODIMENT

Figure 1:
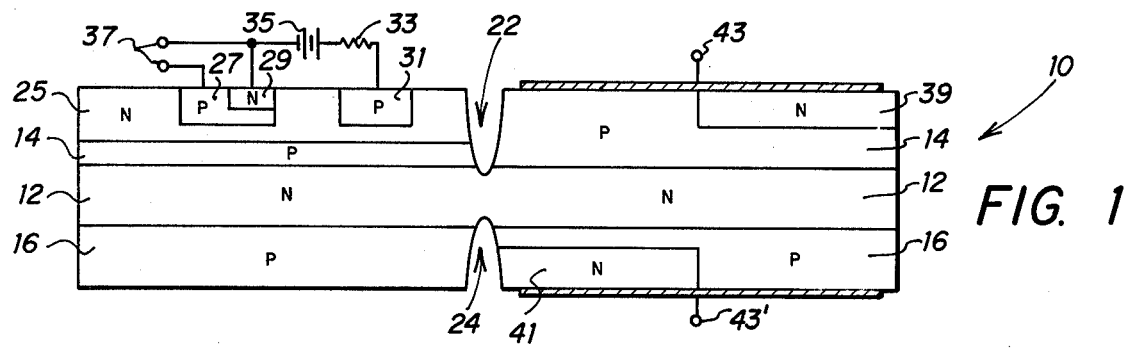
FIG. 1 is a sectional view of a combined actuator-switch according to the invention.

Referring to FIG. 1, a unitary semiconductor body 10 includes a central N-type semiconductor 12 interposed between P-type semiconductor layers 14 and 16. Transverse and opposing grooves 22 and 24 extend through outer layers of the body 10 and into the central layer 12 in order to geometrically and electrically partition the body into two distinct areas. The area to the left of the groove 22 and 24 is formed as an actuator which is responsive to external stimuli in order to generate an activating current. The activating current operates a switch which is formed on the right hand side of the grooves 22 and 24. It will be understood that the actuating stimuli may comprise any of a number of different phenomena. For example, the actuator may be made responsive to magnetic forces in order to operate the switch. Alternatively, the actuator may be responsive to light, radiation or the like in order to actuate the switch. Alternatively, an externally generated electrical activating current signal may be applied to the actuator in order to operate the switch.

In the embodiment illustrated in FIG. 1, the actuator is formed in an N-type semiconductor layer 25 in which are formed a P region 27 and an N region 29. A second P region 31 is also formed in the layer 25. The N region 29 and P region 31 are connected through a resistor 33 and a battery source 35. Terminals 37 are provided to receive an electrical signal. The actuator in FIG. 1 thus operates as an externally fired lateral SCR. Prior to firing, the SCR is reverse biased by operation of the battery 35. It will be understood that the present actuator may comprise regenerative semiconductor switches such as an SCR or triac, or any other type of semiconductor switch which is activated by an electrical signal. Alternatively, as will be subsequently shown, the actuator may comprise a more sophisticated circuit for being actuated by external stimuli such as magnetic fields, lights, radiation or the like.

The switch in the embodiment shown in FIG. 1 comprises a two terminal semiconductor switch including P-N-P layers 14, 12 and 16, in combination with N regions 39 and 41. Layer 14 and region 39 are shorted by an electrode 43, while layer 16 and region 41 are shorted by a terminal 43'.

In operation of the circuit shown in FIG. 1, an actuating electrical signal may be applied from an external source to terminals 37 in order to energize the actuator. Conduction of the actuator causes carriers to be injected into the central N layer 12, the carriers being carried to the switch area of the body 10. The carriers cause the switch to be rendered conductive, thereby applying current to a load or the like.

Figure 2:
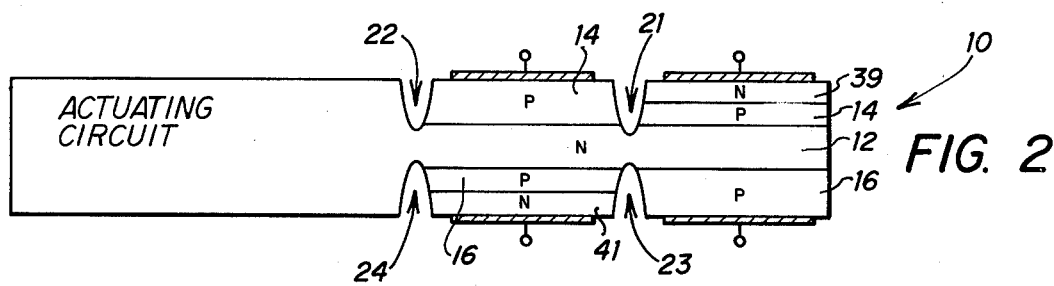
FIG. 2 is a sectional view illustrating a second embodiment of a switch according to the invention.

FIG. 2 illustrates another embodiment of the invention in which the actuating circuit may comprise any suitable actuating circuit, such as the circuitry shown in FIG. 1 or to be subsequently shown. In this embodiment, the switch is identical to that shown in FIG. 1, with the exception of grooves 21 and 23 which are formed to isolate N regions 39 and 41 from P regions 14 and 16. In FIG. 2, the device is illustrated as comprising a four terminal device. If the terminals are interconnected, the device will operate in a similar manner as shown in FIG. 1.

Figure 3:
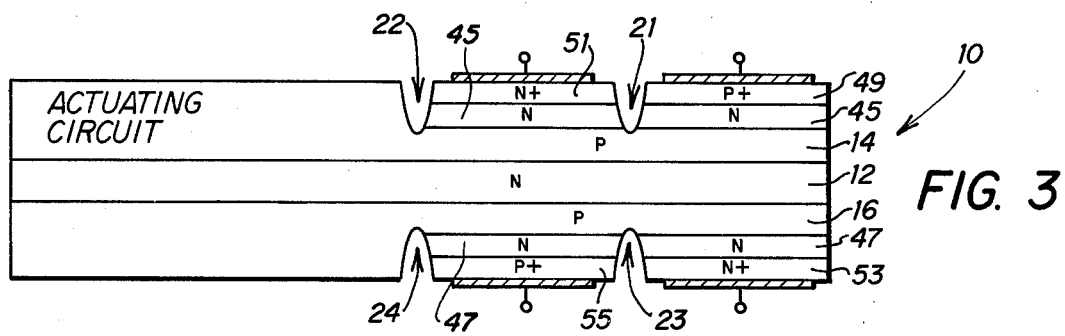
FIG. 3 is a sectional view illustrating a third embodiment of a switch according to the invention.

FIG. 3 illustrates another switch configuration, with like numerals being utilized for like and corresponding parts. The switch includes grooves 21 and 23 which separate portions of the switch. The switch includes a central N-type layer 12 interposed between P-type layers 14 and 16. N layers 45 and 47 are disposed on the P layers 14 and 16, with the N layers 45 and 47 being partitioned by the grooves 21 and 23. A P+ region 49 and an N+ region 51 are formed, along with suitable electrodes, on the N-type layer 45. An N+ region 53 and a P+ region 55 are formed, along with suitable electrodes, on the N layer 47. The switch thus illustrated provides a four terminal switch which may be interconnected to operate as a two terminal switch in the manner of FIG. 1.

Figure 4:
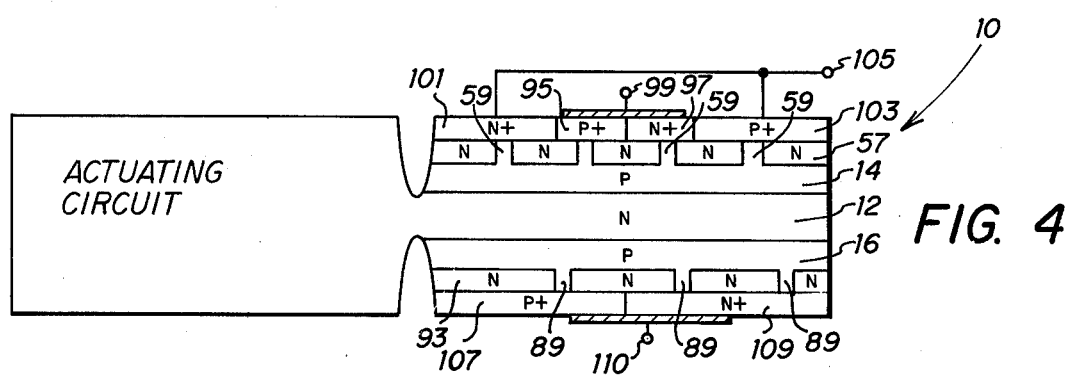
FIG. 4 is a sectional view of a fourth embodiment of a switch according to the invention.

FIG. 4 illustrates another embodiment of the invention illustrating a different switch configuration. The switch shown in FIG. 4 comprises a three terminal symmetrical switch. The switch is comprised of N layer 12 and P layers 14 and 16 in the manner previously described. An N layer 57 is provided, with small columns 59 of P-type material extending through the N-type layer 57. Similarly, small columns 89 of P-type material extend through an N-type layer 93 adjacent P-type layer 16. A gate region is comprised of a P+ region 95 and an N+ region 97 which are shorted by an electrode 99. An N+ region 101 and a P+ region 103 are connected by a second terminal 105. A P+ region 107 and an N+ region 109 are shorted by an electrode 110. The switch illustrated in FIG. 4 operates as a regenerative semiconductor switch which provides improved commutating capability and very high static $dv/dt$.

Figure 5:
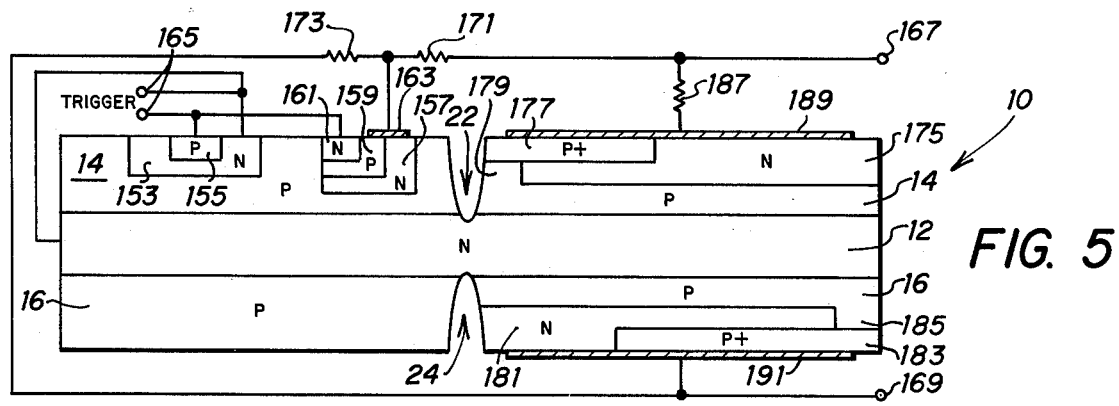
FIG. 5 is a sectional view illustrating a fifth embodiment of a combined actuator-switch in accordance with the invention.

FIG. 5 illustrates yet another embodiment of the present invention, wherein body 10 is comprised of a middle N-type layer 12 superimposed between two P layers 14 and 16. The actuator comprises an N-type region 153 and a P-type region 155 formed in P-type region 14 to form a P-N junction. The actuator further includes an N-type region 157, a P-type region 159 and an N-type region 161 formed within the P-type layer 14. Regions 157-161 form a regenerative semiconductor switch. Regions 157 and 159 are shorted by an electrode 163.

Terminals 165 receive electrical trigger signals when it is desired to actuate the device. The trigger signals are applied to P region 155 and to N regions 153 and 161. A.C. voltage is applied to terminals 167 and 169 in order to provide bias voltage to the actuator through resistors 171 and 173. The junction of resistors 171 and 173 is connected to electrode 163. One of the terminals 165 and the N region 153 are directly connected to the middle N-type region 12.

The switch portion of the body 10 comprises an N-type layer 175 and a P+ region 177. A portion 179 of the P layer 14 extends through the N layer 175 to contact the P+ layer 177. Similarly, the lower portion of the switch includes an N-type layer 181 and a P+ region 183. A portion 185 of the P-type layer 16 extends into contact with the P+ layer 183. An A.C. signal is applied through a load resistance 187 to an electrode 189 which shorts the P+ region 177 and the N layer 175. The A.C. voltage is applied through terminal 169 to an electrode 191 which shorts the N-type layer 181 and the P+ region 183.

In the operation of the device shown in FIG. 5, alternating current is applied to terminals 167 and 169. Prior to actuation, on one-half cycle of the A.C. signal, the upper portion of the switch comprising N-type layer 175 and P+ region 177 is rendered conductive, while on the other one-half cycle of the A.C. signal, the lower portion of the switch comprising N-type layer 181 and P+ layer 183 is energized. The power for the actuator circuit is thus derived from the A.C. signal applied to terminals 167 and 169. When one-half of the switch is energized by the alternating source prior to energization of the actuator, the other half of the switch is reverse biased to from a blocking junction to prevent the flow of carriers through the load. The switch and its associated circuitry thus operates as a full-wave rectifier of the A.C. source signal to thereby supply the power required of the actuator. When the middle N-type layer 12 is positive, the juncture between resistors 171 and 173 is negative. The voltage between the junction between resistors 171 and 173 and the N-type layer 12 is equal to approximately one-half the voltage applied across terminals 167 and 169.

When a trigger signal is applied to terminals 165, the regenerative switching device is fired, thus causing the emission of carriers into the N-type layer 12. These carriers are emitted through the layer 12 in order to render the switch portion of the circuit completely conductive, thereby applying A.C. power through load 187.

Figure 6:
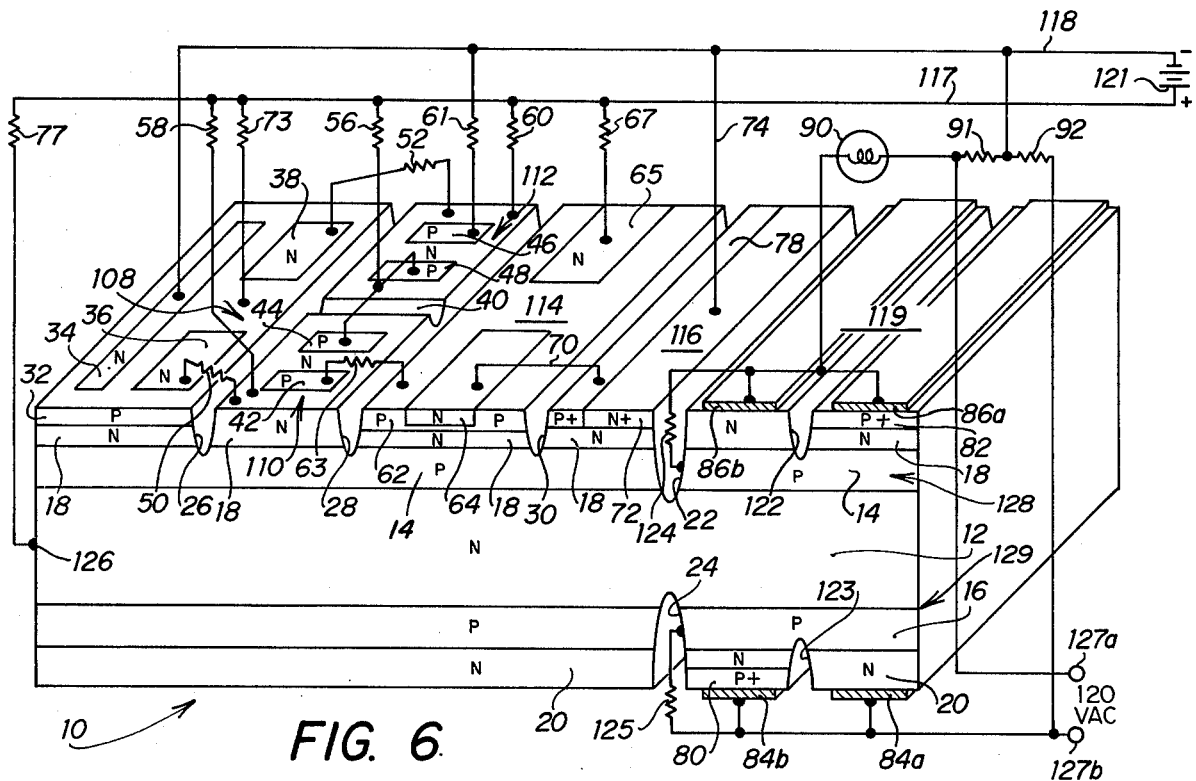
FIG. 6 is a diagrammatic perpsective view of an actuator-switch embodiment of the present invention formed on a single semiconductor body, with power supplied to the actuator from both a battery source and an A.C. power supply connected across the switch.

An important aspect of the present invention is that when the regenerative switch is triggered, it remains on, thereby providing continuous power to the actuator. It may thus be seen that the present invention includes a variety of different combinations of actuators and switches formed on a single substrate. FIG. 6 will now be described in order to illustrate a more complex and practical embodiment of the present invention.

Referring to FIG. 6, a unitary semiconductor body is identified generally by the numeral 10 and comprises a central N-type semiconductor layer 12 interposed between P-type semiconductor layers 14 and 16, with N-type semiconductor layers 18 and 20 exterior to layers 14 and 16, respectively.

Transverse and opposing grooves 22 and 24 extend through outer layers of the body 10 and into central layer 12 to geometrically and electrically partition the body into two distinct areas. More particularly, groove 22 extends downward through layers 18 and 14, while groove 24 extends upward through layers 20 and 16. One of the areas has formed thereon a semiconductor device which is responsive to external stimuli and operates to generate a current activating switching device formed on the second area of the body. While grooves 22 and 24 are illustrated as electrically separating the body into two areas, it will be understood that other structures such as oxide masking or the like may alternatively be utilized to perform such separation.

Transverse channels 26, 28 and 30 extend through the surface of the N-type layer 18 in order to partition the first area of body 10 into four electrically isolated regions. In the first region, a magnetic sensitive device 108 is formed from a P-type layer 32 exterior to layer 18, and from an elongated diffusion 34 and two symmetrical diffusions 36 and 38 of N-type material within layer 32.

In the second layer 18 region formed between grooves 26 and 28, a longitudinal channel 40 partitions the region into two electrically isolated subregions. In one of the subregions, a first PNP transistor 110 is formed from spaced apart P-type diffusions 42 and 44. In the second subregion, a PNP transistor 112 is formed in like manner from two spaced apart P-type diffusions 46 and 48.

The present device may be constructed to be sensitive to any desired external stimuli. For example, the circuitry on the first area of body 10 may comprise a light sensitive device which generates an electrical output signal in response to detection of a predetermined light level. Alternatively, the circuitry formed in the first area may comprise circuitry for sensing electrostatic fields or other types of external field stimuli. The circuitry may also comprise a device responsive to the reception of an electrical input signal applied from an external source.

In the preferred embodiment, the present device will be described as a magnetic field sensitive device generally identified by the numeral 108. The N-type diffusion 36 of the magnetic sensitive device 108 is connected through a resistor 50 to the layer 18 subregion of PNP transistor 110, while the N-type diffusion 38 is connected through a resistor 52 to the layer 18 subregion of PNP transistor 112. In addition, the P-type diffusions 44 and 48 of transistors 110 and 112 are shorted together and applied through a resistor 56 to a lead 117 connected to the positive terminal of a D.C. voltage source or battery 121.

An NPN inverter transistor 114 is formed on a third layer 18 region between grooves 28 and 30. Transistor 114 includes a P-type layer 62 exterior to layer 18 and two N-type diffusions 64 and 65 located on the surface of layer 62.

In addition, an SCR 116 is formed from a fourth layer 18 region between grooves 30 and 22. More particularly, a heavily doped N+ layer 72 and an adjacent heavily doped P+ layer 78 are diffused into layer 18 to form an SCR comprising semiconductor layers 12, 14 or 16, 18, 72 and 78. Semiconductor layer 78 is connected by way of lead 70 to diffusion 64 of transistor 114. Layer 62 of transistor 114 in turn is connected through resistor 63 to diffusion 42 of transistor 110.

The electronic semiconductor devices thus formed in the first area of body 10 are powered by D.C. voltage source 121, and by a 120 VAC power supply (not shown) connected across a semiconductor switch 119 formed on a second area of body 10. The terminals 127a and 127b of the power supply are connected across serially connected resistors 91 and 92. A node intermediate to the resistors 91 and 92 is connected to a lead 118 in turn connected to the negative terminal of source 121. The positive terminal of source 121 is connected by way of lead 117 through resistor 67 to diffusion 65 of transistor 114, and through resistors 60 and 58 to the layer 18 subregions of transistors 112 and 110, respectively. The positive terminal of source 121 is also connected through resistor 56 to diffusions 44 and 48 of transistors 110 and 112, respectively, through resistor 73 to P-type layer 32 of device 108, and through resistor 77 to an ohmic contact 126 formed on central semiconductor layer 12.

The negative terminal of source 121 is connected by way of lead 118 through lead 74 to N+ layer 72 of SCR 116, through resistor 61 to diffusion 46 of transistor 112, and directly to N-type diffusion 34 of device 108. Source 121 is aided by the A.C. power supply in providing power to the first area of body 10 as is explained below.

The electronic circuit of the first area of body 10 thus comprises a magnetic sensing device 108 which operates a circuit comprised of transistors 110 and 112. This circuit in turn drives an inverter transistor 114 controlling the gate electrode of SCR 116. Firing of the SCR 116 injects carriers into the intermediate and central N-type layer 12 to actuate switch 119. Alternatively, the present actuator circuit may be connected to generate an electrical output signal which is connected through wires to the switch 119.

While external resistors are illustrated as being employed to bias the semiconductor devices, it is apparent that the resistors may be integrated into the body 10. Thus, external components are not required for operation of the device.

The semiconductor switch 110 is formed from heavily doped P+ layers 80 and 82 diffused into layers 20 and 18, respectively, as well as from layers 12, 14, 16, 18 and 20. Groove 122 extends downwardly to penetrate through layer 18 and into layer 14 to electrically isolate and space apart electrodes 86a and 86b formed into layers 82 and 18, respectively, while groove 123 extends upward through layer 20 and into layer 16 to electrically isolate and space apart electrodes 84a and 84b formed onto layers 20 and 80, respectively. Electrodes 86a and 86b are connected to one terminal of a light device 90, the other terminal of which is connected to terminal 127a of the A.C. source and through resistors 91 and 92 to electrodes 84a, 84b. A node intermediate to resistors 91 and 92 is connected by way of lead 118 to the negative terminal of source 121. In addition, electrodes 86a, 86b are connected through a resistor 124 to layer 14, while electrodes 84a, 84b are connected through a resistor 125 to layer 16. Electrodes 84a, 84b also are connected to a second terminal 127b of the A.C. source.

Prior to actuation, switch 119 acts in conjunction with source 121 to supply power to the devices formed on the first area of body 10. More particularly, when terminal 127a is at a negative potential relative to terminal 127b, the switch 119 junction between layers 14 and 12 becomes reverse biased to form a blocking junction, while the junction between layers 16 and 12 becomes forward biased. Thus, a high impedance path is presented to terminal 127a while a low impedance conductive path through resistor 125 is presented to terminal 127b. Accordingly, a negative potential is applied through resistor 91 to lead 118, and a positive potential is applied through resistor 125 and across the junction between layers 12 and 16 into layer 12. SCR 116 is forward biased thereby, and a positive potential appears at ohmic contact 126.

When terminal 127a is positive relative to terminal 127b, a conductive path is formed from terminal 127a through resistor 124 and into layer 12. The path from terminal 127b through resistor 125, however, is blocked by the reverse biased junction between layers 16 and 12. A negative potential thus is applied from terminal 127b through resistor 92 to lead 118, and a positive potential appears as before at ohmic contact 126.

Figure 7:
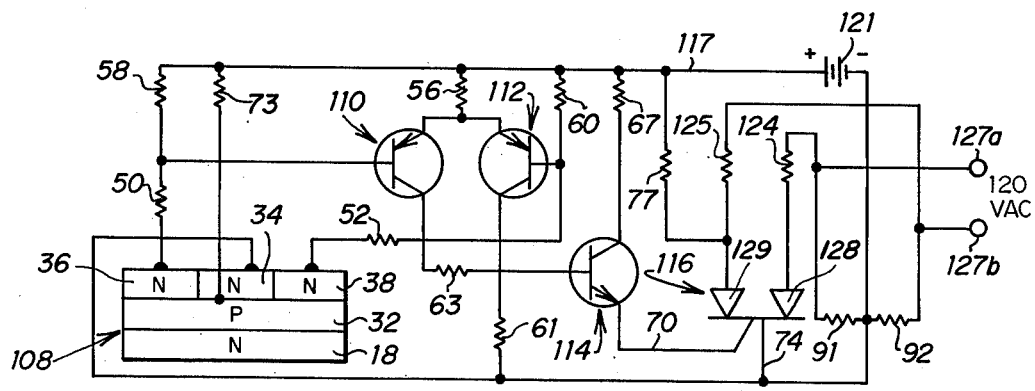
FIG. 7 is an electrical schematic diagram of a portion of the body illustrated in FIG. 6.

An electrical schematic equivalent to a portion of the system shown in FIG. 6 is illustrated in FIG. 7, wherein like numerals refer to the corresponding components of FIG. 6. The magnetic sensitive device 108 as illustrated is comprised of a semiconductor region of N-type layer 18, P-type region 32, two symmetrical N-type diffusions 36 and 38, and an elongated N-type diffusion 34. Diffusion 36 is connected through a resistor 50 to the base of PNP transistor 110, while diffusion 38 is connected through resistor 52 to the base of PNP transistor 112. The N-type diffusion 34 in turn is connected through resistor 61 to the collector of PNP transistor 112, and directly to the cathode of SCR 116.

The collector of transistor 110 is connected through resistor 63 to the base of NPN transistor 114, the emitter of which is connected by way of lead 70 to the gate electrode of SCR 116. The cathode of SCR 116 is connected by way of lead 74 to a node which is intermediate to resistors 91 and 92, and which is connected to the negative terminal of battery 121.

A.C. source terminal 127a is connected to a node intermediate to resistors 91 and 124, and through resistor 124 to the anode of a diode 128 formed from layers 14 and 12 to switch 119. Terminal 127b in turn is connected to a node intermediate to resistors 92 and 125, and through resistor 125 to the anode of a diode 129 formed from layers 16 and 12 of switch 119. The anodes of diodes 128 and 129 are therefore connected to the anode of SCR 116. The common cathode of diodes 128 and 129 is connected through resistor 77 to the positive terminal of battery 121.

The positive terminal of battery 121 also is applied by way of lead 117 through resistor 60 to the base of transistor 112, through resistor 58 to the base of transistor 110, through resistor 56 to the emitters of both transistor 110 and transistor 112, through resistor 67 to the collector of NPN transistor 114, and through resistor 73 to P-type layer 32 at device 108.

In operation, the magnetic sensitive device 108 detects a controlled magnetic field. If no field exists, the currents supplied from the N-type diffusions 36 and 38 are identical and the circuit comprised of transistors 110 and 112 remains at a set state. However, if a magnetic field is detected by device 108, one of the diffusions 36 or 38 generates a current greater than the other. Such an imbalance causes the circuit to change state. As a result, transistor 110 applies a current through resistor 63 to the base of inverter transistor 114 controlling the gate electrode of the SCR 116. The firing of the SCR 116 injects carriers into the central semiconductor layer 12, FIG. 6, which in turn causes semiconductor switch 119 to undergo a state change and thereby create a conduction path through the switch. The 120 VAC source is applied thereby to the light device 90.

By providing a controlled magnetic field with a movable magnetic switch or the like, the present device may be utilized as a solid state relay to replace conventional contact relays and triac combinations, as a solid state light dimmer circuit, or as any similar type of control circuit. As previously noted, however, other devices sensitive to other external stimuli may be substituted for magnetic sensitive device 108.

Figure 8:
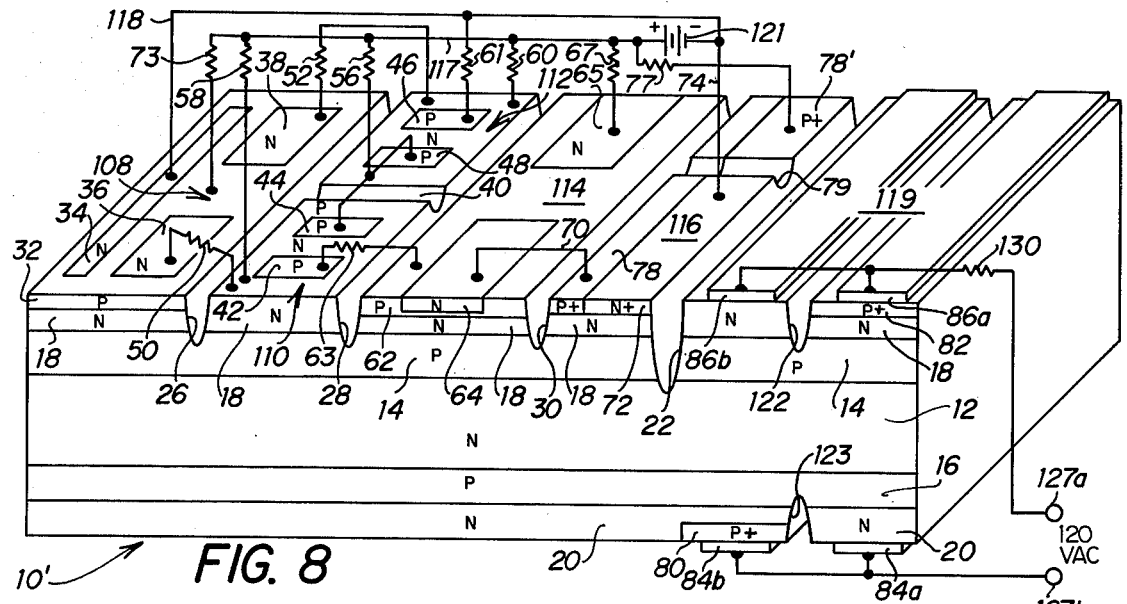
FIG. 8 is a diagrammatic perspective view of the embodiment of FIG. 6, with power supplied to the actuator from a battery source independent of the switch.

Referring to FIG. 8, there is illustrated an actuator-switch system wherein the actuator is powered by a battery independent of a contribution by switch 119. As may be seen by comparison, semiconductor body 10 of FIG. 6 has been slightly modified by removing lower groove 24 and resistor 125 to form body 10'. In addition, circuitry exterior to semiconductor body 10 including resistors 91 and 92, light device 90, and resistor 124 has been removed from the system of FIG. 6. Further, a load resistor 130 has been added between terminal 127a and electrodes 86a-86b. A groove 79 extends across regions 78 and 72 of SCR 116 to form an anode P+ region 78'. The resistor 77 is directly connected to P+ region 78'. Otherwise, like reference numbers in FIG. 8 correspond to like and corresponding component parts in FIG. 6.

With this configuration, the actuator of body 10' draws power from battery 121 exclusively. When a magnetic field is detected by device 108, SCR 116 is fired in a similar manner as before described, and injects carriers into layers 12 and 16 to cause semiconductor switch 119 to undergo a state change. A conduction path is created thereby through switch 19, and the 120 VAC source is applied to load 130.

Figure 9:
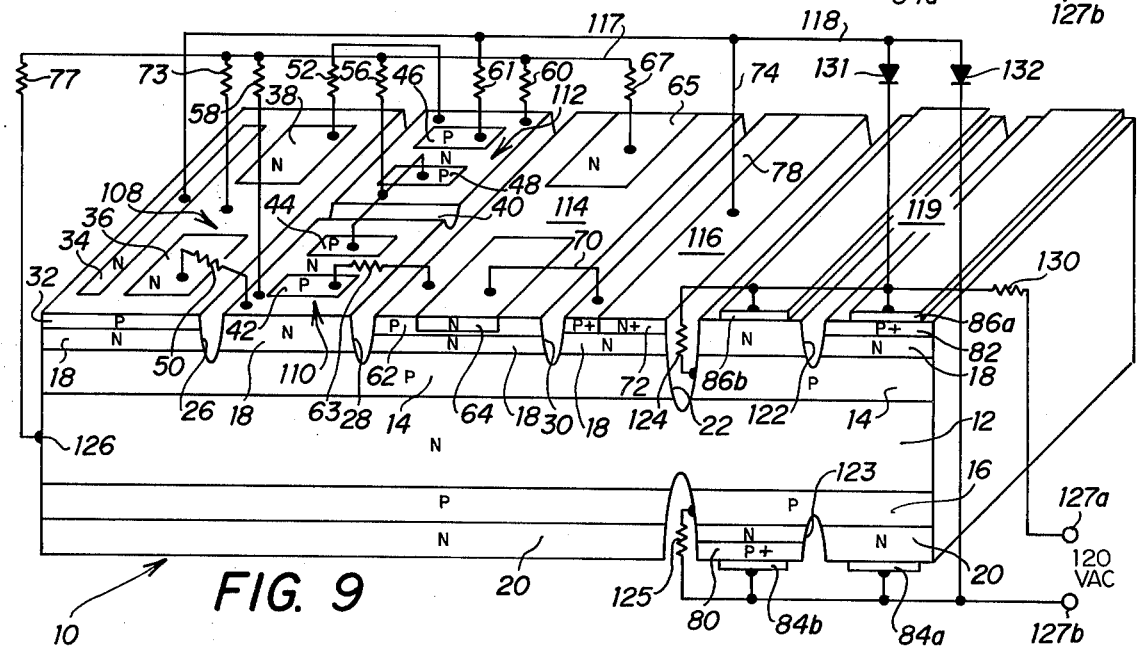
FIG. 9 is a diagrammatic perspective view of the embodiment of FIG. 6, with the actuator drawing power exclusively from an A.C. power supply connected across the switch.

In FIG. 9 there is shown an actuator-switch system wherein the actuator power is drawn exclusively from an A.C. power source connected across switch 119. In this configuration, like reference numbers correspond to like component parts, and the modifications to the system of FIG. 6 are confined to the external circuitry.

More particularly, voltage source 121 of FIG. 6 has been removed, and the lead 118 has been connected to a node intermediate between the anodes of two diodes 131 and 132. The cathode of diode 131 is connected to the electrodes 86a, 86b and through load 130 to terminal 127a. The cathode of diode 132 in turn is connected to the electrodes 84a, 84b and to the terminal 127b. In accordance with the system of FIG. 6, resistor 124 is connected between layer 14 of switch 119 and electrodes 86a, 86b. Further, resistor 125 is connected between layer 16 of switch 119 and electrodes 84a, 84b.

Before switch 119 changes state, the semiconductor layers comprising the switch act in combination with diodes 131 and 132 to provide a full-wave rectification of the A.C. signal applied across terminals 127a and 127b. When terminal 127a is positive relative to terminal 127b, diode 132 is forward biased to provide a negative potential at lead 118. As diode 131 is reverse biased, the positive potential at terminal 127a is blocked from lead 118. In addition, the junction between layers 16 and 12 of switch 119 becomes reverse biased to block the flow of current through resistor 125, while the junction between layers 14 and 12 becomes forward biased. Thus, a low impedance conductive path is formed from terminal 127a through resistor 124 into N-type layer 12.

When terminal 127a is negative relative to terminal 127b, diode 132 becomes reverse biased, while diode 131 becomes forward biased to apply the negative potential at terminal 127a to lead 118. In addition, the junction between layers 14 and 12 of switch 119 becomes reverse biased to form a blocking junction and thus inhibit current flow through resistor 124, while the junction between layers 16 and 12 of the switch becomes forward biased. Thus a low impedance conducting path is formed from terminal 127b through resistor 125 into N-type layer 12. This full-wave rectification process performed by switch 119, acting in combination with diodes 131 and 132, provides a positive potential at contact 126 and a negative potential at lead 118 to power the actuator portion of body 10. The full-wave rectification process continues until a magnetic field is sensed by device 108, thereby causing switch 119 to change state.

It is to be understood that diodes 131 and 132 are representative components of a full-wave rectifier bridge. Other components including resistors, capacitors, inductors, FET's and other semiconductor devices may also be used.

Figure 10:
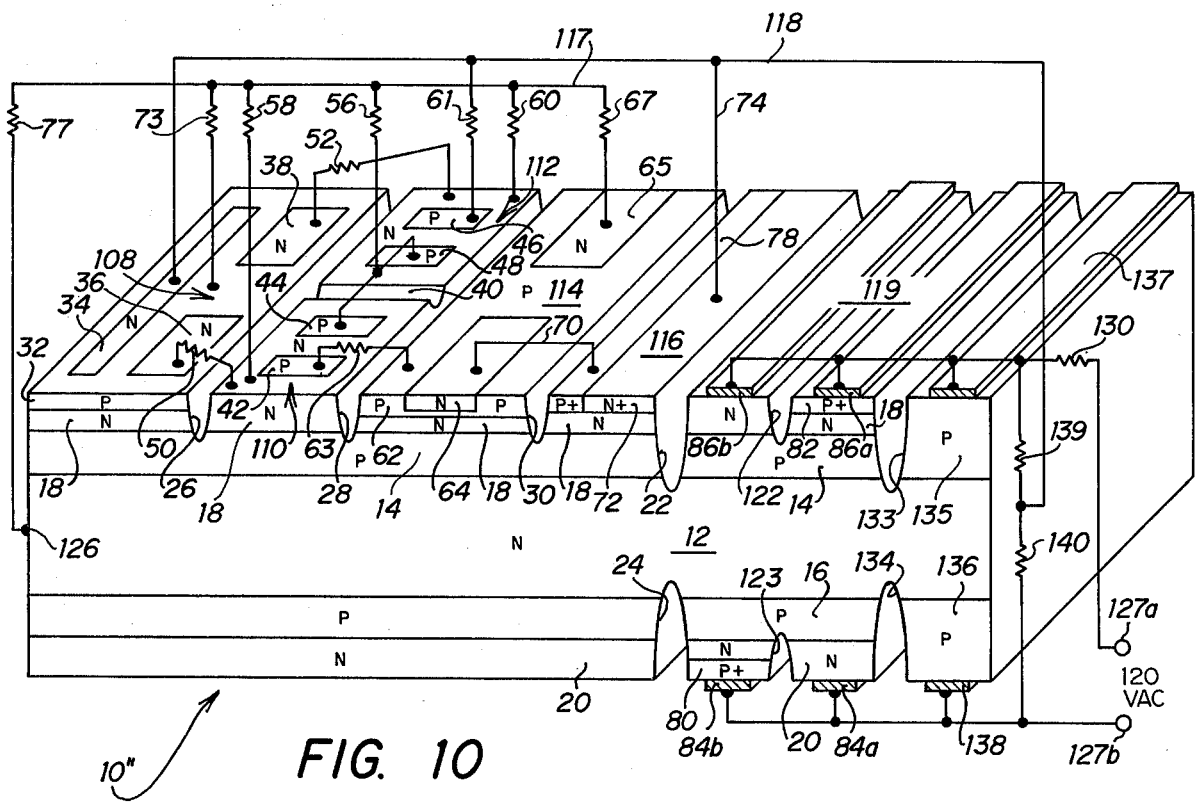
FIG. 10 is a diagrammatic perspective view of an alternate form of the system of FIG. 9 including a semiconductor body having three electrically isolated areas separated apart by grooves.

An alternative to the embodiment of FIG. 9 is illustrated in FIG. 10, where again the actuator portion of an actuator-switch system is powered from an external A.C. source connected across switch 119. In this system, however, a semiconductor body 10″ is seen to differ from semiconductor body 10 of FIG. 6 by an extension which has been added to the semiconductor body and separated from switch 119 by grooves 133 and 134. Groove 133 extends downward from the upper surface of body 10″ and penetrates into the upper surface of layer 12 to electrically isolate and separate apart from switch 119 a P-type region 135, formed on the upper surface of layer 12. Groove 134 in turn extends upward from the lower surface of body 10″ and penetrates into layer 12 to electrically isolate and set apart a P-type region 136, formed on the lower surface of layer 12.

An electrode 137 in contact with the upper surface of region 135 is electrically connected to electrodes 86a and 86b, and further connected through a load resistor 130 to terminal 127a. In like manner, an electrode 138 is connected in parallel with electrodes 84a and 84b to terminal 127b. Electrodes 137 and 138 are also connected to resistors 139 and 140, respectively, having an intermediate node connected to lead 118 to supply a negative potential to the actuator area of body 10″.

Regions 135 and 136, layer 12, and resistors 139 and 140 act in combination to provide a full-wave rectification of the A.C. source signal and to supply thereby the power required of the actuator. More particularly, with terminal 127a positive relative to terminal 127b, blocked junctions are formed across switch 119. However, the junction between region 135 and layer 12 becomes forward biased to provide a low impedance conductive path between terminal 127a and layer 12. A positive potential appears at contact 126 due to the action of carriers. Terminal 127b in turn is connected by way of resistor 140 to lead 118 to provide a negative potential to the actuator of body 10″.

When terminal 127b becomes positive relative to terminal 127a, the process reverses with the junction between region 136 and layer 12 becoming forward biased to form a low impedance conductive path, while terminal 127a is connected through resistor 139 to lead 118 to provide a negative potential to the actuator. Again, switch 119 has formed therein blocking junctions to prevent the flow of carriers from either terminal 127a or 127b into layer 12. In addition, the junction between region 135 and layer 12 becomes reverse biased to also form a blocking junction.

In accordance with the present invention, plural electronic devices are formed on a single semiconductor body to perform a switching operation in response to an external stimuli. Upon detecting the external stimuli, a sensing circuit actuates a semiconductor switch by injecting carriers into a region common to both the sensing circuit and the switch. Construction on a single semicondcutor body is made possible by grooves extending through outer semiconductor layers of the body to physically separate and electrically isolate the plural devices. Planar and other techniques such as ion implantation may alternatively be used to isolate the plural devices.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. An electronic switching device responsive to an external stimuli comprising:
   a unitary semiconductor body having a plurality of outer and interior semiconductor layers and a central semiconductor layer ordered in an array of alternating conductivity types wherein said central semiconductor layer is centrally disposed within said body and is in continuous contact with ones of said interior semiconductor layers;
   isolating means formed across said outer and interior layers of said plurality of semiconductor layers to geometrically separate and electrically isolate first and second areas of said array, with said central semiconductor layer being common to and electrically available to both said first and second areas of said body;

an actuator formed in said first isolated area and sensitive to the external stimuli to generate electrical switching signals upon detection of the external stimuli, said electrical switching signals being conducted from said first area of said body through said central semiconductor layer to said second area of said body to cause a switching operation;

a symmetrical semiconductor switch formed in said isolated area of said body and responsive to said electrical switching signals generated by said actuator and conducted through said central semiconductor layer in order to perform said switching operation in said second isolated area of said body; and alternating current supply means connected to said symmetrical semiconductor switch for being switched in response to the external stimuli.

2. The switching device of claim 1 and further comprising:

a load connected in series with said symmetrical semiconductor switch for being connected across said alternating current supply means in response to the external stimuli.

3. The switching device of claim 1 and further comprising:

means for providing at least a portion of the electrical biasing power for said actuator from said alternating current supply means.

4. The switching device of claim 1 and further comprising:

means for providing all of the electrical biasing power for said actuator from said alternating current supply means.

5. The combination set forth in claim 1 wherein the external stimuli comprises a magnetic field and wherein said actuator comprises a magnetic sensitive device.

6. The combination set forth in claim 1 wherein said alternating current supply means is connected across said symmetrical semiconductor switch and said semiconductor switch is connected to form a half of a full-wave rectifier bridge to supply power to said actuator prior to a switching action.

7. The combination set forth in claim 1 wherein a DC source is connected to said actuator, and said switch is connected to form a half of a full-wave recitifer bridge to supply DC power to said actuator prior to a switching action.

8. The combination set forth in claim 1 wherein said actuator is powered by a DC source electrically isolated from said symmetrical semiconductor switch.

9. An actuator and a semiconductor switch formed in a unitary semiconductor body comprising:

a semiconductor body having at least five layers of alternating first and second semiconductor conductivity types to form two outer layers, two interior layers and a central layer, said outer layers and said central layer being constructed from said first conductivity type and disposed in continuous contact with said interior layers;

isolating means formed across said outer and interior layers and separating at least one of said layers to geometrically and electrically isolate first and second areas of said body, said central layer remaining integral and being common to and electrically available to both said first and second areas of said body;

first regions of said second conductivity type being formed over one of said outer layers in said first and second areas;

second regions of said first conductivity type formed adjacent to at least one of said first regions in said first area to form an actuator, said actuator providing switching signals conducted through said central layer to cause a switching operation;

electrodes contacting said outer layer and electrodes contacting said first regions of said second conductivity type to form a semiconductor switch in said second area responsive to said switching signals conducted through said central layer to perform said switching operation in said second area; and means responsive to an alternating current signal applied across said switch for biasing said actuator.

10. The combination set forth in claim 9 wherein said actuator includes a magnetic sensitive actuator comprising:

a symmetrical device sensitive to magnetic fields;

circuitry for changing states under the control of said symmetrical device;

an SCR for injecting carriers into said interior layers for being conducted through said central layer to said semiconductor switch; and a transistor responsive to said circuitry for controlling the gate electrode of said SCR.

11. The combination set forth in claim 9 wherein said isolating means comprises grooves.

* * * * *

UNITED STATES PATENT AND TRADEMARK OFFICE
CERTIFICATE OF CORRECTION

PATENT NO. : 4,079,407
DATED : March 14, 1978
INVENTOR(S) : Jearld L. Hutson

It is certified that error appears in the above-identified patent and that said Letters Patent are hereby corrected as shown below:

In the Abstract, line 8, "eternal" should be --external--.
Column 2, line 62, "semiconductor 12" should be --semiconductor layer 12--.
Column 4, line 65, "from" should be --form--.
Column 7, line 1, "110" should be --119--.
Column 8, line 63, "19" should be --119--.

Signed and Sealed this

Eleventh Day of July 1978

[SEAL]

Attest:

RUTH C. MASON
Attesting Officer

DONALD W. BANNER
Commissioner of Patents and Trademarks